(12) United States Patent
Maeno

(10) Patent No.: US 7,843,649 B2
(45) Date of Patent: Nov. 30, 2010

(54) MICROLENS, METHOD OF MANUFACTURING MICROLENS, AND PHOTOMASK USED FOR MANUFACTURING METHOD

(75) Inventor: Yoshinori Maeno, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 748 days.

(21) Appl. No.: 11/790,546

(22) Filed: Apr. 26, 2007

(65) Prior Publication Data
US 2008/0080068 A1 Apr. 3, 2008

(30) Foreign Application Priority Data
Sep. 29, 2006 (JP) ............................. 2006-270119

(51) Int. Cl.
*G02B 3/08* (2006.01)
*G02B 7/02* (2006.01)
(52) U.S. Cl. ...................................... 359/741; 359/811
(58) Field of Classification Search .................. 359/619, 359/741, 811, 819
See application file for complete search history.

(56) References Cited

U.S. PATENT DOCUMENTS 7,027,693 B2    4/2006  Maeno et al.
7,345,832 B2 *  3/2008  Shibuya et al. .............. 359/811

FOREIGN PATENT DOCUMENTS

JP     3117886      6/1996
JP     2004-085873  3/2004

* cited by examiner

*Primary Examiner*—William C Choi
(74) *Attorney, Agent, or Firm*—Rabin & Berdo, PC

(57) ABSTRACT

A method of fabricating a microlens that serves to prevent damage thereto in the fabrication process is provided. First, a lens body of which the maximum height housed within a recess is lower than the height of the side wall of the recess is formed in the lens formation region by performing patterning that transfers the shape of a first resist pattern to a substrate by using the first resist pattern as an etching mask. Thereafter, a partial region of the substrate which is outside the lens formation region is removed to form an outline by using a second resist pattern as a mask.

2 Claims, 11 Drawing Sheets

MICROLENS, METHOD OF MANUFACTURING MICROLENS, AND PHOTOMASK USED FOR MANUFACTURING METHOD

BACKGROUND OF THE INVENTION

1. Field of the Invention

The present invention relates to a microlens that is formed by processing a substrate such as a silicon substrate, a method of manufacturing same, and a photomask suitable for use in the manufacturing method.

2. Description of Related Art

The transition to broadband communications in recent years invites the remarkable increase in the amount of traffic. Correspondingly, the popularization of optical communications in which light is used as the medium has been rapid.

Further, where optical modules for sending and receiving optical signals are concerned, the demand for a bi-directional optical communication module such as an optical transceiver, a micro BOSA (Bi-directional Optical Sub-Assembly) or an infrared sensor has increased.

The additional demand with respect to miniaturization and lower costs for such optical modules increases more and more.

With the object of further miniaturizing the optical module, cases where a silicon microlens is adopted have been on the increase. The silicon microlens can be formed by using silicon micro fabrication in particular, which is adopted in the manufacturing process of semiconductor devices.

Japanese Patent No. 3117886 to OKI Electric Industry Co., Ltd. discloses a method of manufacturing such a silicon microlens. The disclosed method employs a mask used for resist pattern for manufacturing a lens. The mask comprises a plurality of mask patterns in which light-shielding regions that are provided in a concentric circle shape or concentric polygonal shape and that separated by gaps serving as light transmission regions on a mask substrate. The width of the gap between two adjacent mask patterns increases at least stepwise moving from the center point of the concentric circle or concentric polygon toward the outer perimeter in the radiation direction. Further, the pitch in the radial direction of the mask pattern is smaller than the length corresponding to a resolution limit of an optical system of an aligner in which the mask is being incorporated. By using the mask, a resist pattern is obtained by exposing a resist on a lens formation substrate by controlling the intensity of light projected from an aligner. The lens is manufactured with the shape of the resist pattern transferred by means of etching process using the resist pattern.

Furthermore, Japanese Patent Application Laid Open No. 2004-85873 (corresponding to U.S. Pat. No. 7,027,693) discloses an optical module including a support substrate and an optical member having formed there at the aforementioned silicon microlens. The optical member is mounted on the support substrate. In that case, the optical member is in contact with the support substrate at a portion of the surface of the optical member facing the support substrate and in non-contact with the support substrate at a remaining portion of the surface with an adhesive material being filled between the non-contact surface portion and the support substrate.

However, according to the above described method of manufacturing a microlens, the minimum pitch, the minimum dimension width and minimum dimension width increment of the mask patterns of a used photomask are subjected to limitations depending on the resolving and dimensional control properties of the aligner. Here, the width increment means the width difference between a width w1 of one mask pattern and a width w2 of the other mask pattern. Accordingly, an applicable lower limit value exists for the minimum pitch, the minimum dimension width and the minimum dimension width increment.

Furthermore, in the aforementioned method, after forming of microlens by processing a substrate, the substrate is subjected to a photolithography step and an etching step at regions outside the microlens region. In that case, the thickness of the resist pattern applied directly onto the microlens is thinner than the thickness in the regions outside the microlens region.

Hence, the upper surface of the microlens is scraped off as a result of the etching process and there is a risk that the optical characteristics of the microlens thus formed will be damaged.

By the way, because the microlens has a minute structure, so that, for facilitating the mounting of a microlens on a support substrate, it is desirable to form a microlens structure having a lens body and a frame for supporting it.

Therefore, the present inventor discovered a technique for forming a photomask that is used to form, through etching, a convex lens as a lens body, using this photomask to form a convex lens in only the first etching processing, and using another photomask to perform a second etching process to form the frame around the convex lens.

SUMMARY OF THE INVENTION

The present invention was conceived in view of the above point. Hence, according to a first aspect of the present invention, there is provided a method of manufacturing a microlens, comprising the steps described below.

First, a substrate having a first surface in which the lens formation region is defined, and a second surface opposite the first surface is prepared.

A first resist pattern in the lens formation region of the substrate by performing patterning process. The patterning process includes exposure process with the use of a photomask for forming a resist pattern having a non-uniform thickness. This photomask has a transparent mask substrate and a plurality of square mask cells formed in a matrix array on the mask substrate. The length of one side of the mask cell is established shorter than the length constituting the resolution limit of the optical system of the aligner in which the photomask is used. The mask cells have either one or both of a light transmission region and a light-shielding region formed by a light-shielding film on the mask substrate. The light intensity of the transmitted light of the mask cell is defined as a normalized light intensity that can be varied for each of mask cells.

A lens body is formed by performing patterning process that transfers the shape of the first resist pattern to the substrate by using the first resist pattern as an etching mask. The maximum height of the lens body housed within a recess is lower than the height of the side wall of the recess in the lens formation region.

A second resist layer is formed over the whole of an exposure surface obtained due to the patterning process.

A second resist pattern is formed by patterning the second resist layer. The second resist pattern covers the lens formation region.

A partial region of the substrate which is outside the lens formation region is removed to form the contour by using the second resist pattern as a mask.

According to the method of manufacturing a microlens of the first aspect of present invention, the lens body of the microlens can be formed in the first etching step by using a photomask with a novel constitution. In addition, after forming the microlens, the shape of the frame portion outside the microlens thus formed can be molded in an arbitrary shape without damaging the optical characteristics of the microlens.

Furthermore, in the step of forming the first resist pattern, the normalized light intensity of the transmitted light of the plurality of mask cells of the microlens is preferably set as follows. Let the light intensity of the mask cell at the center of a first circle having a first radius be set as a first light intensity, where 0<the first light intensity<1. Let all the light intensity of the mask cells in an annular region between the first circle and a second circle with a second radius which is concentric with first circle be set as a second light intensity, where the first radius<the second radius. Let all the light intensity of the mask cells in the region outside the second circle be set as a third light intensity. However, the first light intensity, second light intensity and third light intensity have such a relation that 0≦the third light intensity<the first light intensity and that 0≦the second light intensity<the first light intensity. The light intensities of the sequential mask cells which are lined up on the first radius from the center of the first circle to the second circle are set at values for which the amount of change in the light intensity between a prior mask cell and a subsequent mask cell becomes larger toward the second circle. These values are mutually discrete from the first light intensity to the second light intensity.

Thereupon, according to a preferable embodiment, the step of forming a first resist pattern may be a step in which a pattern comprising a mask flat surface, i.e., the exposure face, a mask recess, and a mask protrusion is formed is acceptable. The mask recess is a hollow given to the mask flat surface and has a mask bottom surface, i.e., a flat surface and having its central axis passing perpendicularly through the center of the mask bottom surface. The mask protrusion protrudes from the mask bottom surface and is formed by a curved surface the thickness of which grows successively thicker toward the center line.

In addition, according to another preferable embodiment, in the step of forming the first resist pattern, a pattern that comprises a mask flat surface, i.e., the exposure surface, a mask recess, a mask stepped portion, and a mask protrusion may be formed; in the step of forming the second resist pattern, a pattern that covers an area on the inside of the upper surface of the mask stepped portion may be formed and, in the step of removing a partial region of the substrate, the second resist pattern may be used as a mask to remove a partial region which is beyond the upper surface of the mask stepped portion. The mask recess is a hollow given to the mask flat surface and has a mask bottom surface, i.e., a flat surface and having its central axis. The mask stepped portion is within the mask recess and has a mask stepped upper surface that is provided in a higher position than the mask bottom surface. The mask stepped portion surrounds the outside of the mask bottom surface. The mask protrusion protrudes from the mask bottom surface and is formed by a curved surface the thickness of which grows successively thicker toward the center line.

In addition, in the above manufacturing method, in the step of forming the first resist pattern, patterning process that comprises exposure process with the use of the following photomask may preferably be performed. Among the plurality of mask cells in the photomask used here, mask cells for which both a light transmission region and a light-shielding region are established are each divided in two by means of a virtual dividing line that is drawn in the column direction of the plurality of mask cells arranged in the form of a lattice. In the respective mask cells, the light transmission region is established on one side of the virtual dividing line and the light-shielding region is established on the other side. Furthermore, for the respective mask cells, the light-transmission region is established on the same side with respect to the virtual dividing line.

Furthermore, according to still another preferable embodiment, the step of forming the first resist pattern may be performed under the condition that the etching selectivity with respect to the first resist pattern of the substrate in the lens formation step is 2.0.

Further, according to a second aspect of the present invention, there is provided a microlens that has the following constitution.

The microlens comprises a container-like frame portion with a recess and a lens body that is provided in the recess and which is integrated with the frame potion. The maximum height of the lens body is lower than the height of the peripheral wall portion of the frame portion.

Such a constitution allows light to be condensed from an extremely wide range.

Further, the ratio between the distance from the inside wall edge of the frame portion to the outer edge of the lens body, the height of the peripheral wall portion of the frame portion and the width of the peripheral wall portion may preferably be in the range from 1:1:1 to 1:2:2.

According to still further embodiment of the constitution of the microlens of the present invention, the maximum height of the lens body is higher than the height of the frame portion.

In the above constitution of the microlens, the material used for the frame portion and lens body may preferably be silicon.

Further, according to a third aspect of the present invention, there is provided a photomask used for forming a resist pattern having a non-uniform thickness which is suitable for application to the above mentioned method of manufacturing a lens. The photomask comprises a transparent mask substrate and a plurality of square mask cells that are provided to the mask substrate in a closely arranged manner. The length of one side of the mask cells is set shorter than the length which is a resolution limit of an optical system of an aligner in which the photomask is incorporated. The mask cells comprise either one or both of light transmission regions and light-shielding regions that are formed by a light-shielding film that is provided on the mask substrate. The light intensity of the transmitted light of the mask cells is defined as a normalized light intensity. The light intensity of the transmitted light of the plurality of mask cells is set as follows. The light intensity of the mask cells at the center C of a first circle with a first radius R1 is set as a first light intensity $I_1$ (where $0<I_1<1$). All the light intensities of the mask cells in the annular region between the first circle and a second circle with a second radius R2 (where R1<R2) that is concentric with the first circle is set as the second light intensity $I_2$. All the light intensities of the mask cells in the region outside the second circle are set as a third light intensity $I_3$ (where $I_1$, $I_2$, and $I_3$ are such that $0 \leq I_3 < I_1$ and $0 \leq I_2 < I_1$).

In such photomask, the light intensities of the sequential mask cells lined up on the first radius from the center C of the first circle to the second circle are set at values for which the amount of change in the light intensity between a prior mask cell and a subsequent mask cell becomes larger toward the second circle, these values being mutually discrete from the first light intensity $I_1$ to the second light intensity $I_2$.

In this photomask, $I_1$, $I_2$, and $I_3$ may preferably be related such that $0 \leq I_3 < I_1 < I_2 < 1$.

Furthermore, $I_1$, $I_2$, and $I_3$ may preferably be related such that $0 \leq I_1 < I_3 < I_2 < 1$.

In addition, $I_1$, $I_2$, and $I_3$ may preferably be related such that $0 \leq I_3 < I_1 < I_2 < 1$.

BRIEF DESCRIPTION OF THE DRAWINGS

The foregoing and other objectives and advantages as well as the constitutional feature and function of preferred embodiments will be better understood from the following description taken in connection with the accompanying drawings, in which:

in FIG. 9(C), the position in the X direction is plotted on the horizontal axis and the light intensity of the transmitted light is plotted on the vertical axis;

DESCRIPTION OF THE PREFERRED EMBODIMENTS

Figure 1A:
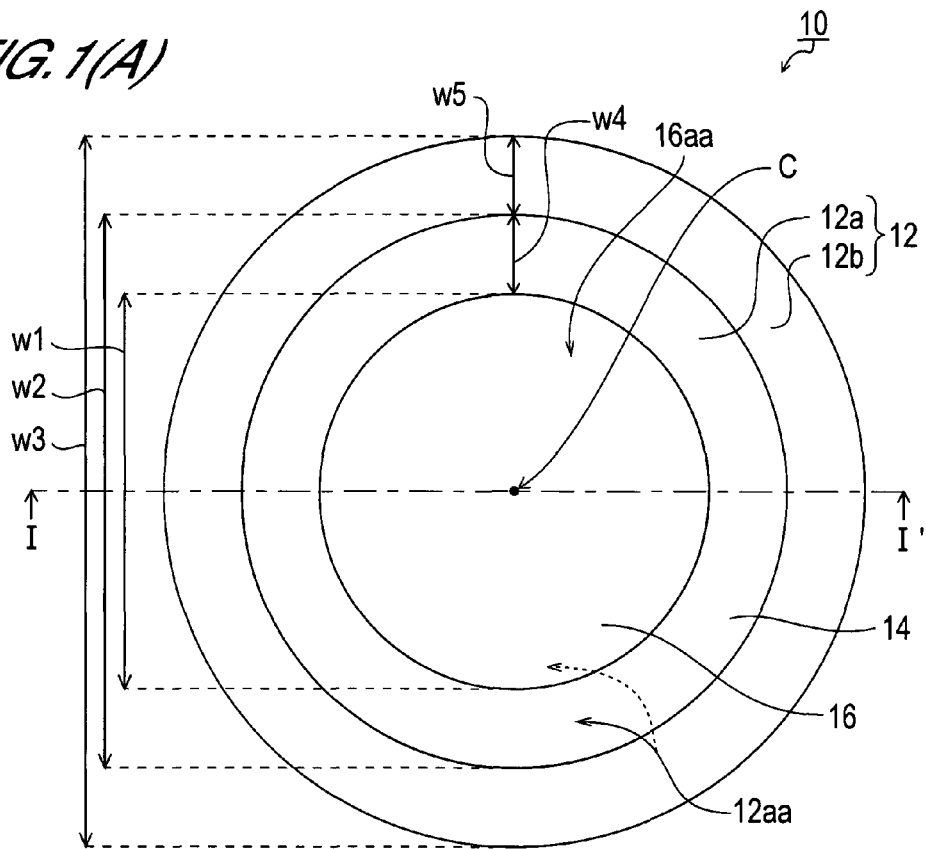
FIG. 1(A) is a planar view of the microlens of a first embodiment according to the invention.

The inventions will be described hereinbelow with reference to the drawings showing respective embodiments. Incidentally, the shape, size and dispositional relationship of the respective constituent elements are shown merely schematically in the drawings to be referred on such a level that the inventions can be understood. Accordingly, these inventions are not particularly limited to the embodiments shown in the drawings. Further, although the specified materials, conditions and numerical conditions and so forth are sometimes used in the following description, they represent merely preferred embodiments and, hence, the inventions are not limited in any way thereto.

Further, the respective manufacturing steps in the method of manufacturing the microscopic optical elements of the present invention can, as a general rule, be carried out by using conventional well-known materials and manufacturing devices, with the exception of the photomask. Hence, a detailed description of the materials and conditions and so forth in the respective manufacturing steps is sometimes also omitted.

First Embodiment

1. Microlens

A constitutional embodiment of the microlens of the invention will now be described with reference to FIGS. 1(A) and 1(B). The "microlens" will be referred to simply as the 'lens' hereinbelow.

Figure 1B:
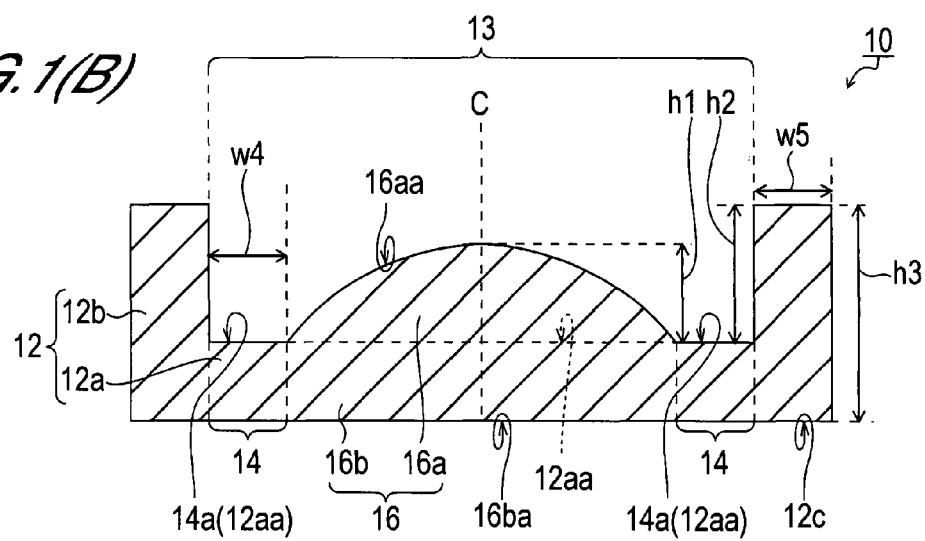
FIG. 1(B) is a schematic view showing a cross section taken along the dot chain line I-I' of FIG. 1(A)

In the constitutional example shown in FIGS. 1(A) and 1(B), a lens 10 comprises a container-like frame portion 12 and a lens body 16. The frame portion 12 has a dish type container-like form. Specifically, the frame portion 12 has a U letter-like vertical cross section and a form of a petri dish with no lid. The outer contour of the frame portion 12, viewing from above or below, is a circle with a diameter w3 at the center of which is the central axis C, and the contour, viewing from the lateral direction, is a rectangle.

The frame portion 12 has a disk-like bottom portion 12a of uniform thickness and a peripheral wall portion 12b perpendicular thereto. The peripheral wall portion 12b rises perpendicularly with respect to the bottom portion 12a from the periphery of the bottom portion 12a and which is formed integrally with the bottom portion 12a. The diameter of the bottom portion 12a is w2. The thickness and height of the peripheral wall portion 12b are uniform, respectively. The height from the bottom surface of the peripheral wall portion 12b is h3 and the thickness of the peripheral wall portion 12b is w5.

Therefore, the outer diameter w3 of the lens 10 corresponds to the sum of the diameter w2 of the bottom portion 12a and 2×w5 which is two times the thickness of the peripheral wall portion 12b. The lower surface 12c faces toward the outside of the frame portion 12 and comprises the lower faces of the bottom portion 12a and peripheral wall portion 12b. The lower surface 12c is a flat surface.

The upper surface 12aa of the bottom portion 12a opposite the lower surface 12c of the frame portion 12 also forms a flat surface. The bottom of the recess 13 which is formed surrounded by the bottom portion 12a and peripheral wall portion 12b forms the upper surface 12aa of the bottom portion 12a.

According to the constitutional example of the lens 10, a protrusion 16a is formed on the upper surface 12aa of the bottom portion 12a of the frame portion 12 as an integral portion thereof. The protrusion 16a is formed as for example a spherical segment with circular periphery. The maximum height and a diameter of the protrusion 16a are shown by h1 and w1, respectively. The central axis of the protrusion 16a is shown by C. A lens body 16 is constituted by the protrusion 16a and a regional part 16b of the bottom portion 12a directly below the protrusion 16a. Hence, the lens body 16 takes the form of a plano-convex lens in which the surface of the protrusion 16a is the first surface 16aa and the flat lower surface of the regional part 16b is the second surface 16ba. The convex surface of the protrusion 16a forms a part of a spherical surface.

As a result of the protrusion 16a being formed on the upper surface 12aa of the bottom portion 12a, the planar shape of the flat bottom surface 14a that remains around the protrusion 16a as a part of the upper surface 12aa is an annular shape. The outer diameter of the flat bottom portion 14 is w2, the inside diameter of the flat bottom portion 14 is w1 and the width thereof is w4.

Thus, the lens 10 is formed of a recess 13 that is surrounded by a part of the peripheral wall portion 12b and the bottom portion 12a of the frame portion 12 and the protrusion 16a.

The shape of the lens body 16 as seen from above is a circle with a diameter w3 that shares the central axis C of the frame portion 12 and recess 13 as shown in FIG. 1(A).

Furthermore, as shown in FIG. 1(B) showing a cross-section view taken in a plane including the central axis C, the thickness of the protrusion 16a of the lens body 16 changes successively. In other words, the first surface 16aa of the protrusion 16a is an arc shape. Thus, in this constitutional example, the protrusion 16a corresponds to a part of the spherical surface of protruding from a bottom surface 14a, that is, the flat upper surface 12aa of the bottom portion 12a.

Here, the position in which the thickness or height h1 of the protrusion 16a is maximum taking the bottom surface 14a as a reference level is on the central axis C.

This height h1 is lower than the height h2 of the peripheral wall portion 12b of the frame portion 12 for which the bottom surface 14a is taken as a reference.

In the case of the microlens 10 of the first embodiment, the ratio between the distance from the edge of the inside wall of the peripheral wall portion 12b of the frame portion 12 to the peripheral edge of the protrusion 16a, that is, the width w4 of the flat bottom portion 14, the height h2 of the peripheral wall portion 12b, and the width w5 of the peripheral wall portion 12b, that is, w4:h2:w5 may be preferably from 1:1:1 to 1:2:2 when the strength of the frame portion 12 and the additional formation of an anti-reflection film or the like are considered. Specifically, w4:h2 may be preferably set in the range of 1:1 to 1:2 and w2:w5 in the range from 1:1 to 1:2.

Examples to be designed the size of the microlens 10 of the first embodiment are given below. The lens diameter shown by the width w1 will be around 250 μm and the height h1 of the lens body 16 around 7.1 μm. In this case, the radius of curvature will be around 1100 μm.

Furthermore, the height h2 of the peripheral wall portion 12b will be around 10 μm and the width w5 of the peripheral wall portion 12b around 18 μm. In addition, the width w4 will be around 10 μm.

Thus, the height h1 of the lens body 16 is lower than the height h2 of the peripheral portion 12b. This means that the protrusion 16a of the lens body 16 is held within the recess 13. Therefore, the lens body 16 can be effectively prevented from damage thereto even when the lens 10 is being formed or used.

2. Method of Manufacturing a Microlens.

The method of manufacturing a microlens of the first embodiment will be described hereinbelow with reference to the drawings. Here, a method of manufacturing a silicon microlens using a silicon substrate will be described by way of example.

Figure 2A:
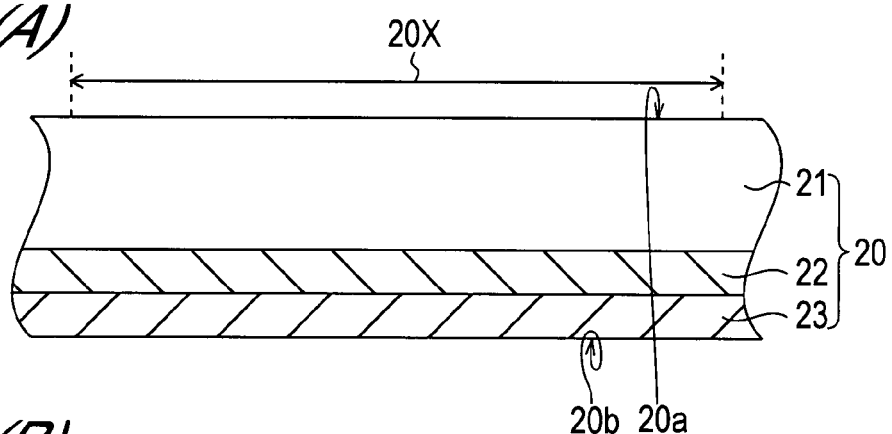
FIGS. 2(A), 2(B), and 2(C) are cross-sectional views for explaining one embodiment of a fabrication process of the microlens.

First, as shown in FIG. 2(A), a parallel planar substrate 20 is prepared. The substrate 20 has a first surface 20a and a second surface (also simply called a rear surface) 20b that faces the first surface 20a. A lens formation region 20X is defined on the first surface 20a beforehand.

For this substrate 20, an SOI (Silicon On Insulator) substrate is preferably used, which comprises a first silicon layer 21, a BOX layer 22, and a second silicon layer 23 stacked in this order from above.

More specifically, an SOI substrate of a 6-inch (approximately 15.24 cm) diameter and for which the thickness of the uppermost first silicon layer 21 to which a lens is formed is around 100 μm may be employed, for example.

The substrate 20 applicable to the first embodiment is not limited to a silicon substrate. A variety of types of substrate such as preferably a glass substrate, a germanium substrate, or an InP substrate can also be employed.

Figure 2B:
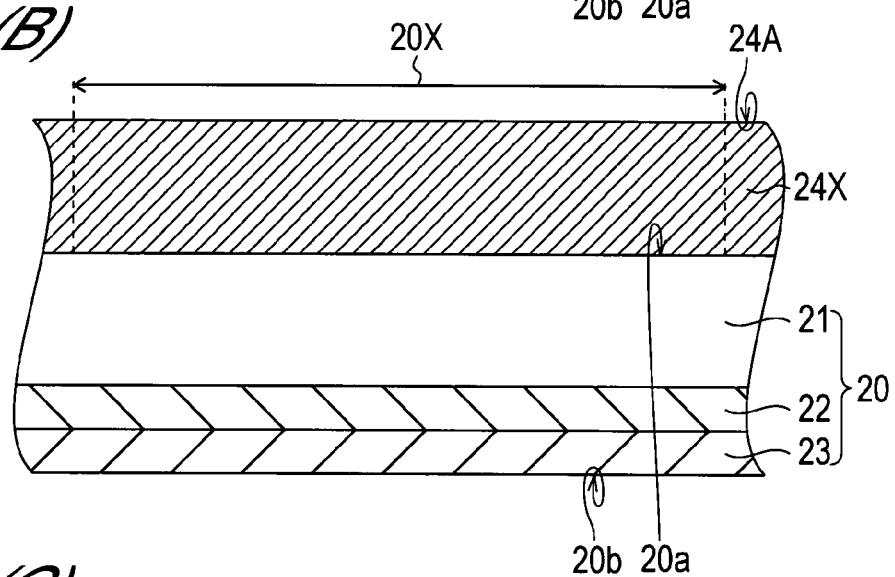

As shown in FIG. 2(B), a positive resist is applied in this example onto the first surface 20a of the substrate 20 to form a first resist layer 24X. Examples of resist materials that are suitable for adoption include IX 410 (referred to hereinbelow simply as material A) which is manufactured by JSR Corp.

The formation of the first resist layer 24X may be performed by means of a spin coating procedure that employs a conventional well-known spin coater. The thickness of the first resist layer 24X is preferably in a range on the order of 3.5 μm to 4.0 μm, for example.

Pre-bake processing is then performed on the substrate 20 on which the first resist layer 24X is formed. The pre-bake processing may be performed under conditions which are compatible with the selected resist material. The pre-bake processing may be performed preferably for sixty seconds at an atmospheric temperature of 90° C., for example, when the above mentioned resist material A is employed.

Then, the exposure processing of the photolithography step will be performed.

A special photomask is used for the exposure process. The reason is that in the next etching step of the exposure process, a resist pattern with a special form in order to residually form the lens 10 from the first silicon layer 21 is required.

In order to form the resist pattern with the special form, a photomask with a novel form which is compatible for use in the resist pattern formation is necessary. The specific constitution of the novel photomask, called as "exposure photomask", that is used will be described later.

The exposure processing may be performed by using a conventional well-known i-line stepper. Examples of an i-line stepper suitable for application include the NSR-2205i11D (trade name) which is manufactured by Nikon Corp. (referred to simply as the 'i-line stepper A' hereinbelow).

When exposure process is performed by using the i-line stepper A, exposure process for 280 milliseconds, for example, is preferably performed.

Thereafter, post-exposure bake processing is carried out. In the above aspect, post-exposure bake processing for 100 seconds may be preferably carried out at an atmospheric temperature of 110° C., for example.

As a result of adopting the above described special photomask, an extremely accurate resist pattern shape can be formed even in the case-where the resist pattern has a complex shape such as a level difference of a plurality of steps in particular or a curved surface that is approximated by this plural-step level difference.

Development processing is performed next using developing fluid. For the developing fluid, an arbitrary developing fluid that is suitable for the selected resist material can be used. When the resist material A described above is used, development processing for ninety seconds may be carried out preferably using an alkaline developing fluid, for example, the NMD-3 (trade name) manufactured by Tokyo Ohka Kogyo Co., Ltd.

Figure 2C:
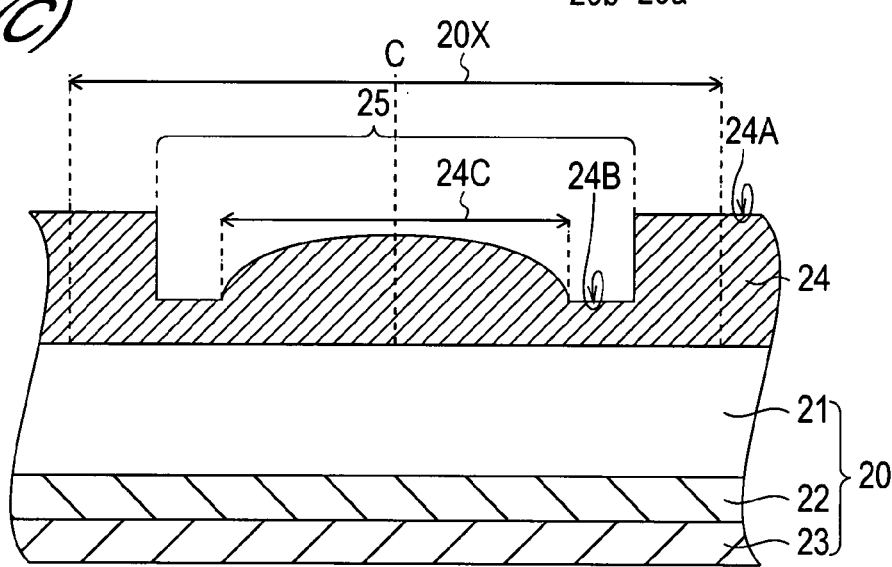

Thereafter, post-development baking is performed under arbitrary conditions that are suitable for the selected material. When the resist material A is employed, a first resist pattern 24 as shown in FIG. 2(C) is obtained by preferably performing post-development baking for 100 seconds at an atmospheric temperature of 120° C., for example.

The first resist pattern 24 is formed as a pattern with a mask recess 25. The mask recess 25 is formed in the form of a hollow of the mask flat surface 24A which is the exposure surface. The convexo-concave shape of the first resist pattern 24 which defines the mask recess 25 is made to correspond with the convexo-concave shape of the surface of the lens 10 described with reference in FIGS. 1(A) and 1(B).

The mask recess 25 has its flat, mask bottom surface 24B which is on a level within the thickness of the first resist pattern 24. A mask protrusion 24C in a form of the spherical segment protrudes from the mask bottom surface 24B of the mask recess 25. The resist thickness of the mask protrusion varies so as to increase successively toward the central axis C.

The mask bottom surface 24B of the mask recess 25 surrounds the outer perimeter of the mask protrusion 24C and has an annular shape, viewing from above the mask bottom surface 24B.

The planar shape of the mask protrusion 24C as viewed from above is a circle the center point of which is the central axis C. In the mask protrusion 24C, the part through which the central axis C passes gives the highest point, that is, the part for which the thickness is greatest.

The diameter, height, and radius of curvature of the mask protrusion 24C can be made optionally suitable by considering conditions such as the shape of the lens that is ultimately formed and the etching selectivity during lens formation.

Thus, by performing a photolithography process on the resist layer by using a photomask that will be described later, the first resist pattern 24 with a pattern surface of varying depth from the surface of the resist layer depending on the given location is formed.

The patterning process for the first silicon layer 21 is carried out in the usual manner by using the first resist pattern 24 as an etching mask.

Figure 3A:
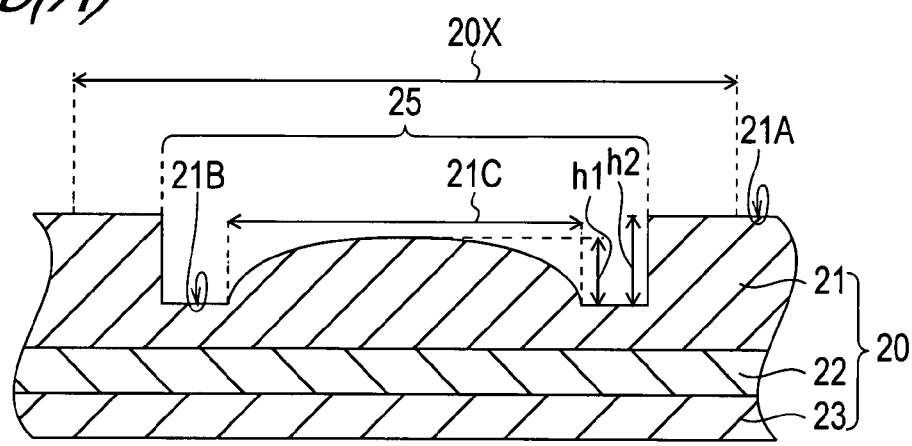
FIGS. 3(A) and 3(B) are cross-sectional views continuing on from FIG. 2(C)

Referring to FIG. 3(A), in the patterning process, the shape of the first resist pattern 24 is transferred to the first silicon layer 21 while the first resist pattern 24 itself is removed.

The patterning process is performed while removing the first resist pattern 24 by means of anisotropic etching from a direction perpendicular to the substrate surface. As the etching advances, part of the first resist pattern 24 gradually disappears and accordingly the outline shape of the first resist pattern 24 gradually retreats. Accordingly, the first silicon layer 21 correspondingly exposed and patterned by etching of the exposed regions of the layer 21.

Specially, as the etching advances, the mask bottom surface 24B of the mask recess 25 of the first resist pattern 24 first disappears and etching is started in the region of the exposed first silicon layer 21.

Thereafter, the protrusion where the mask protrusion 24C remains as a result of the etching up to this point is etched and disappears starting at the periphery of this protrusion and working gradually to the top thereof. The region of the first silicon layer 21 that is sequentially exposed as a result is etched in order of exposure. Thus, the etching region gradually widens from the edge side of the mask protrusion 24C toward the highest point at the central axis C.

This etching is stopped at the same time as the first resist pattern 24 disappears as a result of etching, that is, at the point where the shape of the first resist pattern 24 has been transferred to the first silicon layer 21. As a result of the etching, a lens body 21C that protrudes from the flat bottom surface 21B is finished.

Thereupon, part of the first silicon layer 21 that is located directly below the mask flat surface 24A remains. The part that remains of the first silicon layer 21 is called the remaining portion hereinbelow.

As a result of the etching process, the outline shape of the surface of the pattern formed through patterning on the first silicon layer 21 corresponds to the contour shape of the pattern surface of the first resist pattern 24.

As a result of the etching process, the maximum thickness of the lens body 21C, that is, the maximum height h1 taking the flat bottom surface 21B as a reference level is lower than the height h2 from the flat bottom surface 21B to the surface of the remaining portion.

Therefore, the lens body 21C is completely housed in the recess 25 defined by the flat bottom surface 21B and the remaining portion.

Accordingly, in the following processes, the lens body 21C is also effectively protected by the side wall of the recess defined by the remaining portion that surrounds the lens body 21C.

This patterning process can be performed preferably by using a conventional well-known etching device that comprises an RF generator, for example. Thereupon, a mixed gas of $SF_6$ gas and $O_2$ gas may preferably be used as the etchant.

The formation of the mask protrusion 24C and the etching of the first resist pattern 24 may be performed by setting conditions on the premise that the etching selectivity with respect to the first resist pattern 24 of the first silicon layer 21 is preferably 2.0, for example.

As a result of the above processes, the pattern shape of the first resist pattern 24 is transferred to the first silicon layer 21 and the lens body 16 (21C) that has an optical function as a microlens is finished in the lens formation region 20X.

Thereafter, the photolithography step and etching step for the purpose of carving the microlens, that is, the patterning step, is carried out.

Figure 3B:
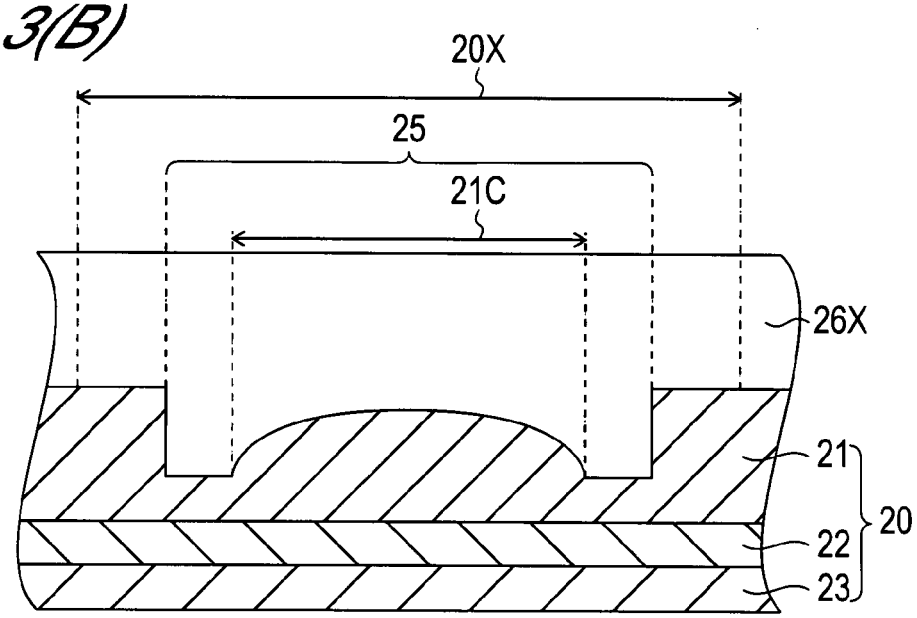

As shown in FIG. 3(B), a positive resist is preferably applied to the whole of the exposure surface to form a second resist layer 26X. The positive resist is preferable resist material A described earlier, for example. The second resist layer 26X may be formed at a step of using a conventional well-known spin coater to rotationally apply the selected resist material. The thickness of the second resist layer 26X may be preferably on the order of 4 µm, for example.

The maximum height h1 of the lens body 21C taking the flat bottom surface 14a (21B) as a reference level is lower than the height h2 from the flat bottom surface 21B to the surface of the remaining portion. Hence, the thickness of the second resist layer 26X can be made thicker than the conventional thickness, in particular directly above the lens body 21C.

Subsequently, as per the patterning process described earlier, under arbitrary conditions suitable for the selected resist material, pre-bake processing, exposure processing, post-exposure processing, development processing, and post-development bake processing are carried out in that order.

Figure 4A:
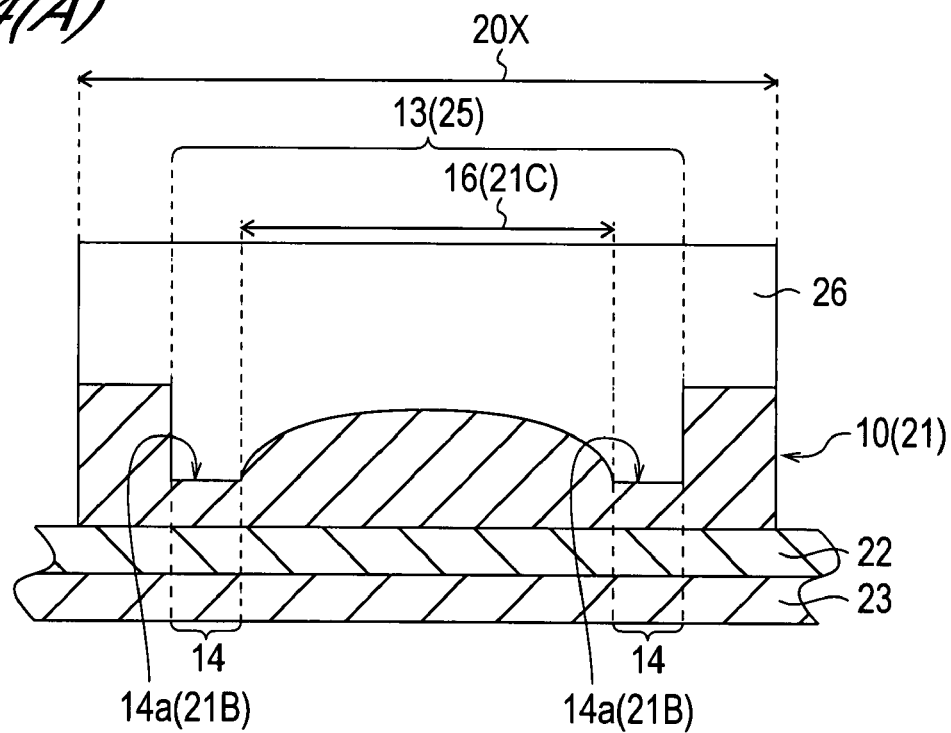
FIGS. 4(A) and 4(B) are cross-sectional views continuing on from FIG. 3(B)

As shown in FIG. 4(A), a second resist pattern 26 covering the lens formation region 20X, in which the recess 25 formed in the first silicon layer 21 is included, is formed as a result of the above processes.

Thereafter, the second resist pattern 26 is used as a mask and, in accordance with the usual method; the first silicon layer 21 is patterned through etching of a partial region of the first silicon layer 21 other than the lens formation region 20X.

The etching is performed up to the exposure of the BOX layer 22 outside the lens formation region 20X.

This etching may preferably be performed by means of the ICP Bosch method using the ICP (Inductively Coupled Plasma) system, for example. For example, a side wall protection step may be performed using $C_4F_8$ and etching may be performed using $SF_6$ as the etchant.

According to the etching, by suitably repeating the side wall protection step and the etching, patterning that reaches a greater depth can be implemented.

Thereupon, the second resist pattern 26 has a greater thickness directly above the lens body 21C in particular. Hence, there is no risk of the second resist pattern 26 being scraped off and disappearing until the etching outside the lens formation region 20X is complete.

Hence, the previously formed lens body 16(21C) can be effectively prevented from being damaged by the step of etching.

After the etching has ended, the second resist pattern 26 is removed. The microlens 10, which has been finished further, is peeled from the BOX layer 22.

Figure 4B:
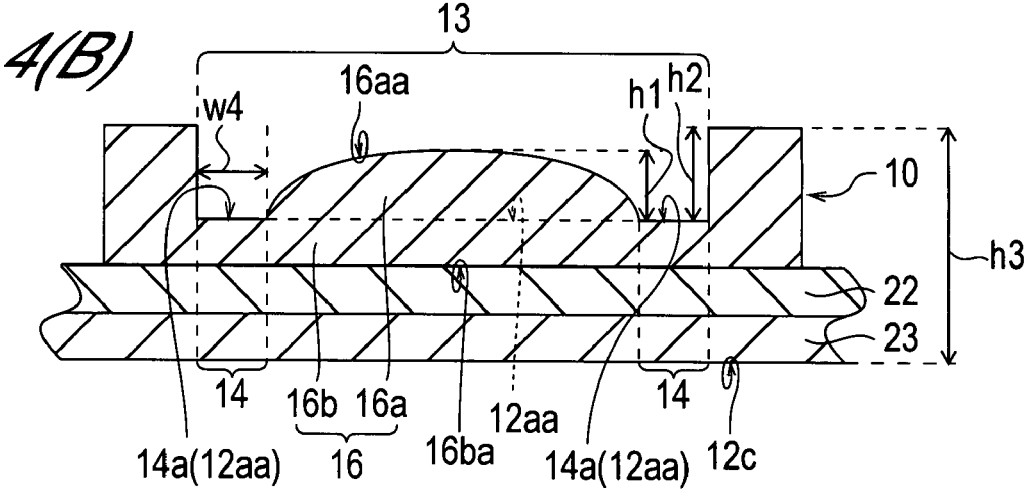

As shown in FIG. 4(B), the silicon microlens with the already mentioned constitution is finished through the above processes.

Further, although an example in which a positive resist was used as the resist material has been described, a negative resist can also be used.

Furthermore, although an example of forming a convex lens has been described, a concave lens can also be formed.

In the process of forming the second resist pattern 26, if the second resist pattern 26 covers only the area of the recess 25, the microlens without the peripheral wall portion 12b can also be manufactured.

According to the method of manufacturing a microlens of the first embodiment, a lens body in which the highest point of the height of the lens portion, that is, the point where the thickness is greatest exists can be formed in a position lower than the surface of the frame portion. As a result, it is possible to secure a thickness that is thicker than a conventional thickness for the resist mask that is used for the external formation that is formed directly on the recess. Therefore, the microlens can be manufactured without damaging the optical characteristics. In other words, a frame portion of an optional shape can be molded without damaging the optical characteristics of the microlens.

Second Embodiment

1. Microlens

Additional constitutional examples of the microlens of the second embodiment will now be described with reference to FIGS. 5(A) and 5(B). Further, the suitable manufacturing device, materials, and conditions are the same as those of the examples mentioned relating to the first embodiment and a detailed description thereof will therefore be omitted.

The microlens 210 of this example features the height h2 of the peripheral wall portion 212b of the frame portion 212 which is lower than the height h1 of the lens body 216.

Figure 5A:
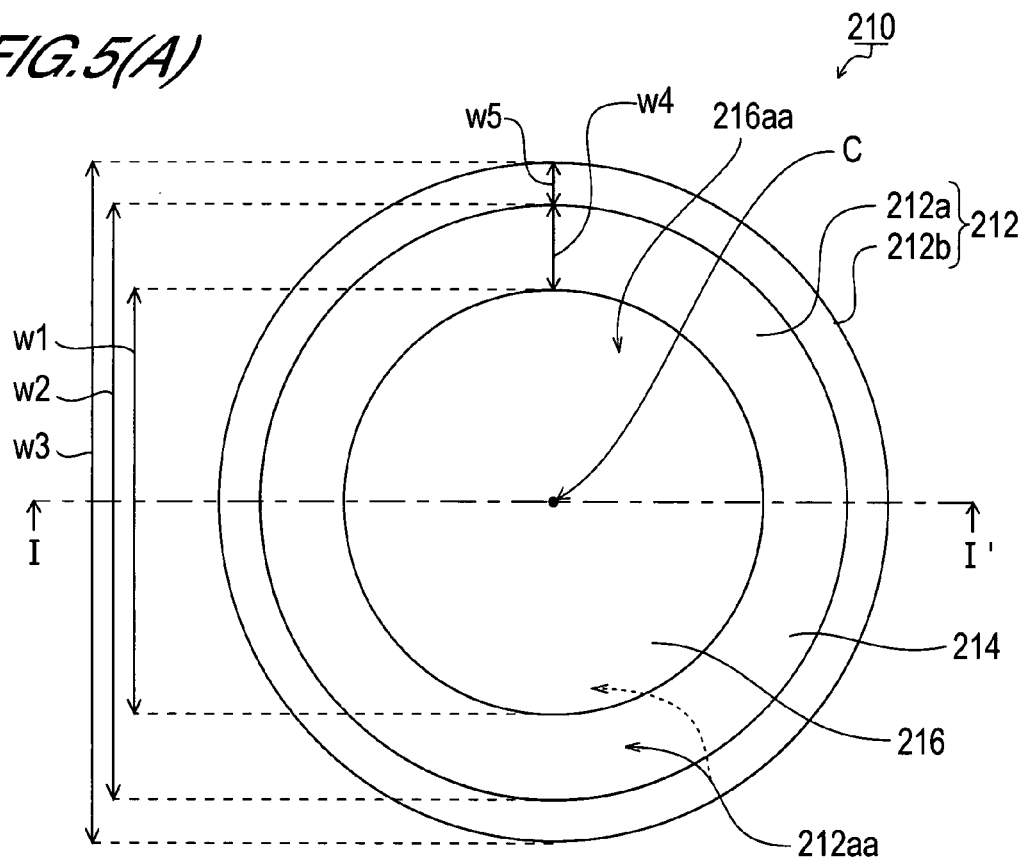
FIG. 5(A) is a planar view of the microlens of a second embodiment according to the inventions.
Figure 5B:
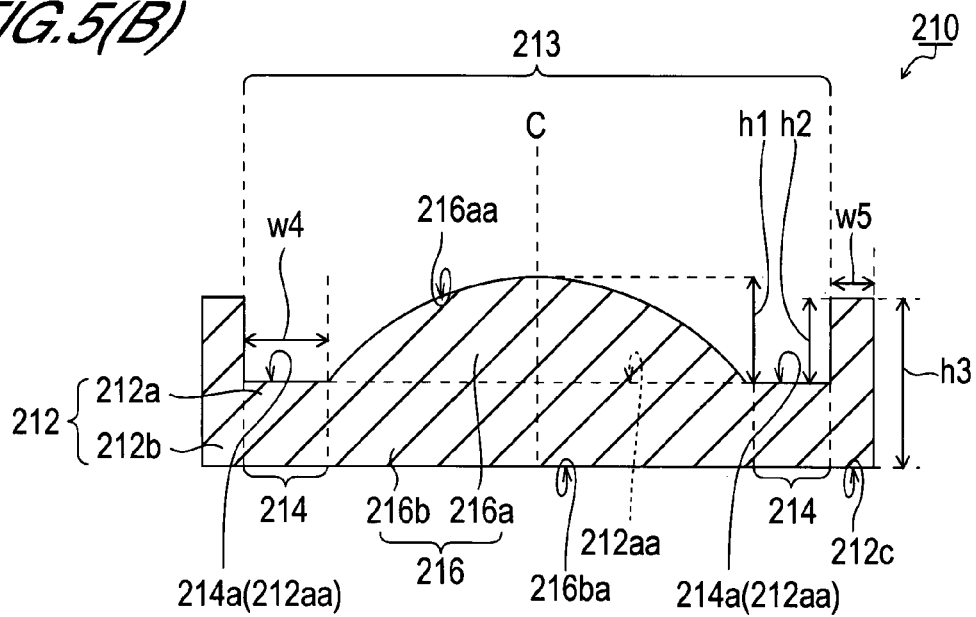
FIG. 5(B) is a schematic diagram showing a cross section taken along the dot chain line I-I' of FIG. 5(A)

Referring to FIGS. 5(A) and 5(B), the lens 210 comprises a container-like frame portion 212 and a lens body 216. The frame portion 212 has a dish type container-like form. Specifically, the frame portion 212 has a U letter-like vertical cross section and a form of a petri dish with no lid. The outer contour of the frame portion, viewing from above and below it, is a circle with a diameter w3 according to the central axis C. The contour of the frame portions, viewing from the side is a rectangle.

The frame portion 212 has a disk-like bottom portion 212a of uniform thickness and a peripheral wall portion 212b perpendicular thereto. The peripheral wall portion 212b rises perpendicularly with respect to the bottom portion 212a from the peripheral border of the bottom portion 212a and is formed integrally with the bottom portion 212a. The diameter of the bottom portion 212a is w2. The thickness and height of the peripheral wall portion 212b are uniform. The height from the bottom surface of the peripheral wall portion 212b is h3 and the thickness of the peripheral wall portion 212b is w5.

The lower surfaces of the bottom portion 212a and peripheral wall portion 212b form together the bottom surface facing to the outside of the frame portion 212. The lower surface 212c is a flat surface.

The upper surface 212aa of the bottom portion 212a opposite the lower surface 212c of the frame portion 212 also forms a flat surface. The bottom of the recess 213, which is formed surrounded by the bottom portion 212a, and peripheral wall portion 212b forms the upper surface of the bottom portion 212a.

According to the constitutional example of the lens 210, a protrusion 216a is formed on the upper surface of the bottom portion 212a of the frame portion 212. The protrusion 216a is a circle with a diameter w1 across the central axis C and has a height h1. A lens body 216 is constituted by the protrusion 216a and a regional part 216b of the bottom portion 212a directly below the protrusion 216a. Hence, the lens body 216 takes the form of a plano-convex lens in which the surface of the protrusion 216a is the first surface 216aa and the flat lower surface of the regional part 216b is the second surface 216ba.

As a result of the protrusion 216a being formed on the upper surface 212aa of the bottom portion 212a, the planar shape of the flat bottom surface 214a that remains around the protrusion 216a as a part of the upper surface 212aa is an annular shape. The outer diameter of the bottom portion 214 is w2, the inside diameter of the bottom portion 214 is w1 and the width thereof is w4.

Thus, the lens 210 is formed of a recess 213 that is surrounded by a part of the peripheral wall portion 212b, a port of the bottom portion 212a of the frame portion 212 and the protrusion 216a.

The shape of the lens body 216, viewing from above it, is a circle with a diameter w3 across the central axis C common to the frame portion 212 and recess 213 as shown in FIG. 5(A).

Furthermore, as shown in FIG. 5(B), when viewed in a cross-section having the central axis C thereon, the thickness of the protrusion 216a of the lens body 216 changes successively. In other words, the surface of the protrusion 216a is an arc shape. In other words, in this constitutional example, part of the spherical surface of the protrusion 216a is a form that protrudes from a bottom surface 214a which is a part of the flat upper surface of the bottom portion 212a.

In this example, the position in which the height h1, that is, the thickness of the protrusion 216a is maximum taking the bottom surface 214a as a reference level resides on with the central axis C.

In this example, this height h1 is higher than the height h2 of the frame portion 212 for which the bottom surface 214a is taken as a reference level. In other words, the lens body 216 protrudes from the frame portion 212.

Thus, the height h1 of the lens body 216 of this example is higher than the height h2 of the frame portion 212, and accordingly the lens 210 is able to condense light from an extremely wide angle.

2. Method of Manufacturing a Microlens

The method of manufacturing a microlens of the second embodiment will now be described with reference to the drawings. Further, the conditions for performing the respective steps and so forth are the same as those for the first embodiment, except for the shape of the first resist pattern and the accompanying change in shape. Hence, with the exception of cases where a description is particularly required, a detailed description of these conditions is sometimes omitted.

Figure 6A:
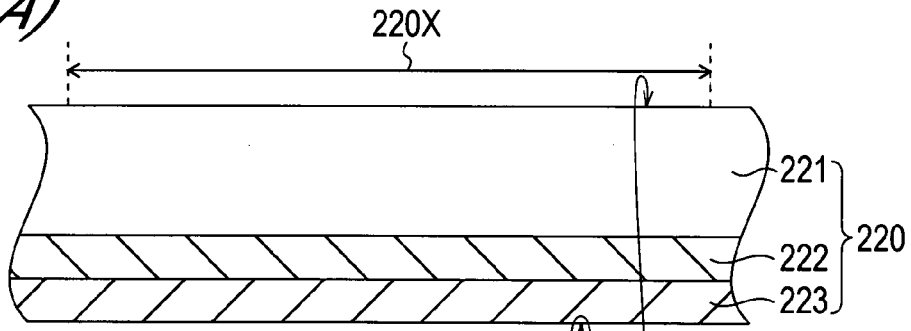
FIGS. 6(A), 6(B), and 6(C) are cross-sectional views for explaining another embodiment of a fabrication process of the microlens.

First, as shown in FIG. 6(A), a substrate 220 is provided. The substrate 220 has a first surface 220a and a second surface 220b opposite to the first surface 220a. A lens formation region 220X is previously defined on the first surface 220a.

Figure 6B:
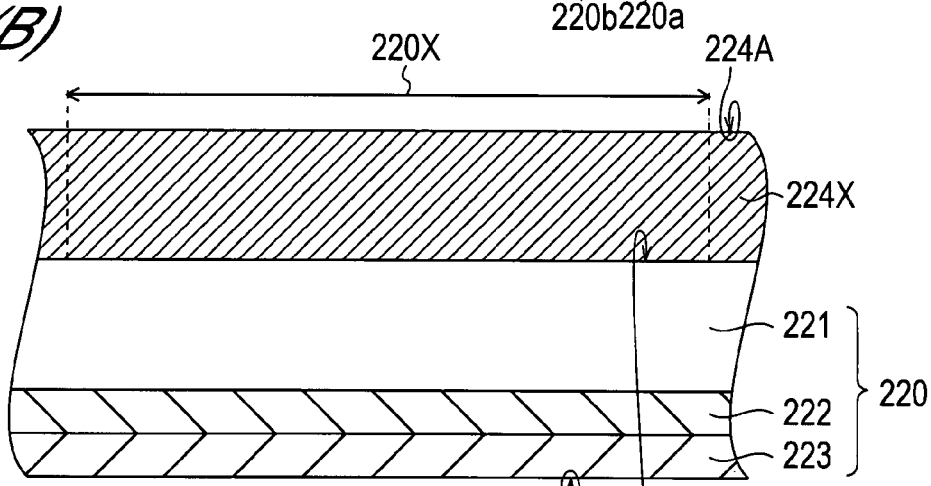

As shown in FIG. 6(B), a positive resist is applied in this example onto the first surface 220a of the substrate 220 to form a first resist layer 224X.

The formation of the first resist layer 24X may be performed by means of the spin coating using a conventional well-known spin coater.

Pre-bake processing is then performed on the substrate 20 on which the first resist layer 24X has been formed. The pre-bake processing may be performed under conditions depending on the selected resist material.

Exposure processing is then performed. The exposure processing may be performed by using a conventional well-known i-line stepper. Post-exposure bake processing is then carried out.

The specific constitution of the photomask that is used in the exposure processing will be described later.

As a result of adopting this photomask, an extremely accurate resist pattern shape can be formed even in the case of a complex shape such as a level difference of a plurality of steps in particular or a curved surface that is approximated by this plural-step level difference.

Development processing is performed next using developer. Any suitable developer can be used for developing the selected resist material.

Figure 6C:
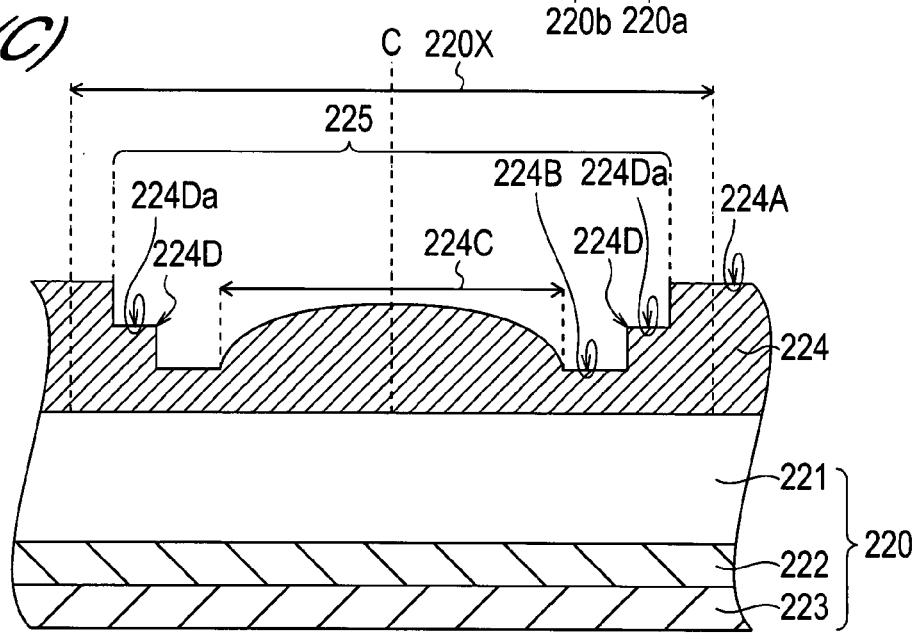

Post-development bake processing is then performed under arbitrary conditions suitable for the selected material. As a result of performing the post-development bake processing, the first resist pattern 224 shown in FIG. 6(C) is obtained.

The first resist pattern 224 is formed as a pattern with a recess 225 depressed from the flat mask surface 224A which is the exposure surface. The recess 225 is hereinafter called a "mask recess 225".

The mask recess 225 has its bottom surface 224B which is a flat surface at a level lower than the maximum height, corresponding to the top surface 224A of the first resist pattern 224 within the lens formation region 220X.

Furthermore, the first resist pattern 224 of this example has a mask stepped portion 224D between the top surface 224A of the first resist pattern 224 and the mask bottom surface 224B. The mask stepped portion 224D has a mask stepped portion upper surface 224Da which is a flat surface parallel to the mask bottom surface 224B.

The mask stepped portion upper surface 224Da surrounds the outside of the mask bottom surface 224B and has an annular shape the outline of which is a circle, viewing from above. The convexo-concave shape of the first resist pattern 224 that defines the mask recess 225 corresponds to the convexo-concave shape of the surface of the lens 210 illustrated in FIGS. 5(A) and 5(B).

A mask protrusion 224C protrudes from the bottom surface 24B of the recess in such a form that part of a spherical surface protrudes and that the resist thickness varies so as to increase successively toward the central axis C.

The bottom surface 224B of the recess surrounds the outer perimeter of the mask protrusion 224C and has an annular shape, viewing from above.

The planar shape of the mask protrusion 224C as viewed from above is a circle the center point of which resides on the central axis C. The mask protrusion 224C has the highest on the central axis C.

The diameter, height or thickness, and radius of curvature of the mask protrusion 224C can be made optionally suitable by considering conditions such as the shape of the lens that is ultimately formed and the etching selectivity, i.e., the etching selective ratio during lens formation.

Thus, by performing a photolithography step on the resist layer by using a photomask that will be described later, the resist pattern 224 with pattern surfaces of varying depth from the surface of the resist layer depending on the given location is formed.

The patterning step for the first silicon layer 221 is carried out in the usual manner by using the first resist pattern 224 as an etching mask.

Figure 7A:
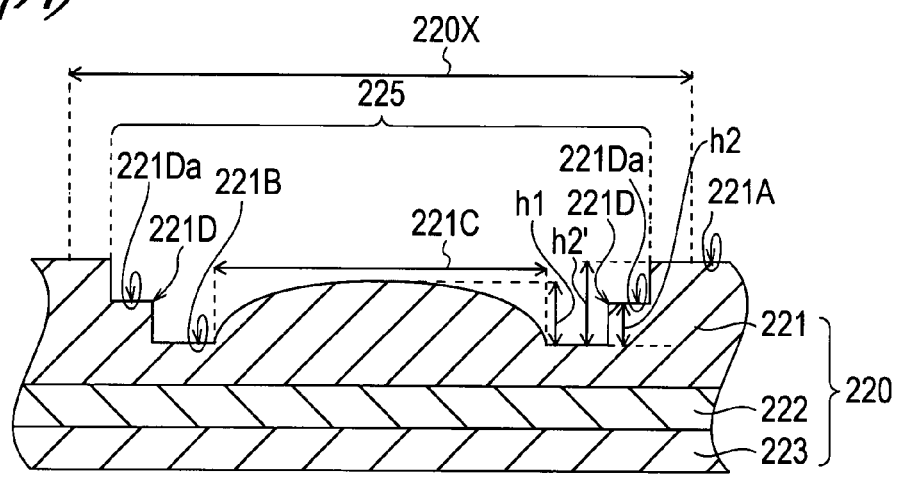
FIGS. 7(A) and 7(B) are cross-sectional views continuing on from FIG. 6(C)

As shown in FIG. 7(A), in the patterning step, the shape of the first resist pattern 224 is transferred to the first silicon layer 221 while the first resist pattern 224 itself is removed.

The patterning step is performed while removing the first resist pattern 224 by means of anisotropic etching from a direction perpendicular to the substrate surface. As the etching advances, the outline shape of the first resist pattern 224 gradually reduces in a similar manner by gradual disappearance of part of the first resist pattern 224, thereby sequentially appearing part of the first silicon layer 221. The exposed region of the first resist pattern 224 is sequentially patterned by this etching.

The etching is stopped at the same time as the first resist pattern 224 disappears, that is, at the point where the shape of the first resist pattern 224 has been transferred to the first silicon layer 221. As a result of the etching, a lens body 221C that protrudes from the flat bottom surface 221B is finished.

Thereupon, part of the first silicon layer 221 (the remaining portion) located directly below the mask flat portion 224A remains as a non-etched portions. The non-etched part is also called "remaining portion".

As a result of the etching step, the outline shape of the surface of the pattern formed through patterning of the first silicon layer 221 corresponds to the contour shape of the pattern surface of the first resist pattern 224.

Further, a stepped portion 221D with a stepped portion surface 221Da located between the remaining portion and the flat bottom surface 221B is formed within the lens formation region 220X wherein the protrusion 221C is also formed. Thereupon, the height h2 of the stepped portion 221D, that is, the height from the flat bottom portion 221B to the stepped portion surface 221Da is lower than the height h1 of the protrusion 221C.

As a result of the etching process, the maximum thickness of the lens body 221C, that is, the maximum height h1 with the flat bottom surface 221B taken as the reference level is lower than the height h2' from the flat bottom surface 221B to the surface of the remaining portion.

Therefore, the lens body 221C is housed in the recess defined by the flat bottom surface 221B and the remaining portion.

Accordingly, also in the following process, the lens body 221C (216) is effectively protected by the side wall of the recess defined by the remaining portion surrounding the lens body 221C.

The patterning step can be performed preferably by using a conventional well-known etching device that comprises an RF generator, for example.

As a result of the above step, the pattern shape of the first resist pattern 224 is transferred to the first silicon layer 221 and the lens body 216 (221C) with an optical function of a micro lens is finished in the lens formation region 220X.

Thereafter, the photolithography step and etching step for the purpose of carving the microlens, that is, the patterning step, is carried out.

Figure 7B:
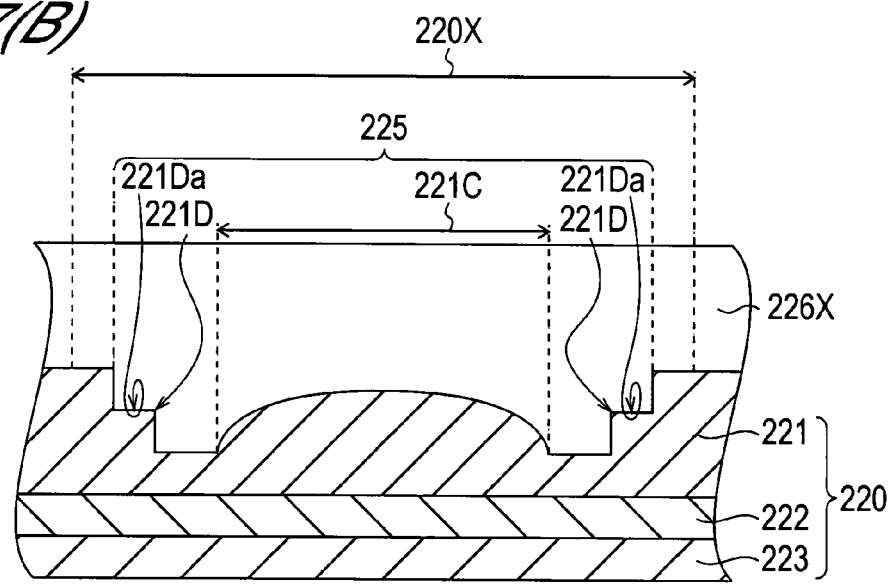

As shown in FIG. 7(B), a positive resist is applied to the whole of the exposure surface to form a second resist layer 26X. The second resist layer 226X may be formed by spin coating the selected resist material onto the exposed surface with the use of a conventional well-known spin coater.

The maximum height h1 of the lens body 221C taking the flat bottom surface 221B as a reference level is lower than the height h2' from the flat bottom surface 221B to the surface of the remaining portion. Hence, the thickness of the second resist layer 226X can be made thicker than the conventional thickness, in particular directly above the lens body 221C.

Subsequently, as per the patterning step described earlier, under arbitrary conditions suitable for the selected resist material, pre-bake processing, exposure processing, post-exposure processing, development processing, and post-development bake processing are carried out in that order.

Figure 8A:
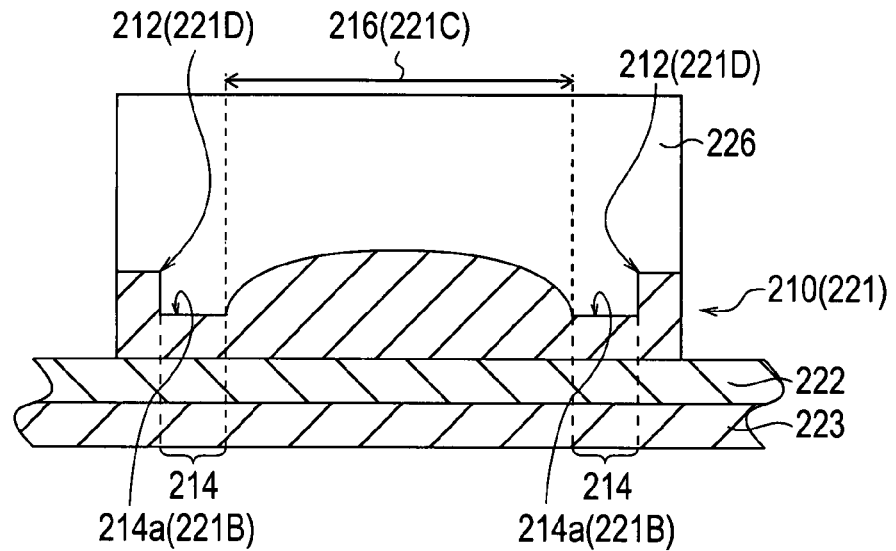
FIGS. 8(A) and 8(B) are cross-sectional views continuing on from FIG. 7(B)

As shown in FIG. 8(A), as a result of an above mentioned sequence of steps, in this example, a second resist pattern 226 is formed which fills in the recess 25 therewith. Accordingly, the second resist pattern covers a surface area including the stepped portion surface 221Da, the bottom surface 221B and the convex surface of the lens body 216a, while exposing the region outside the stepped portion surface 221Da.

Thereafter, the second resist pattern 26 is used as a mask and, in accordance with the usual method, the first silicon layer 21 is patterned through etching. The etching results in removing a partial region of the first silicon layer 221 other than the lens formation region 220X. The etching is performed up to the exposure of the BOX layer 222 outside the lens formation region 220X as per the first embodiment previously described.

Thereupon, the second resist pattern 226 has a greater thickness directly above the lens body 221C in particular. Hence, there is no risk of the second resist pattern 226 being scraped off and disappearing until the etching outside the stepped portion surface 221Da is complete.

Hence, the lens body 221C thus formed can be effectively prevented from damage caused by the step of etching.

Figure 8B:
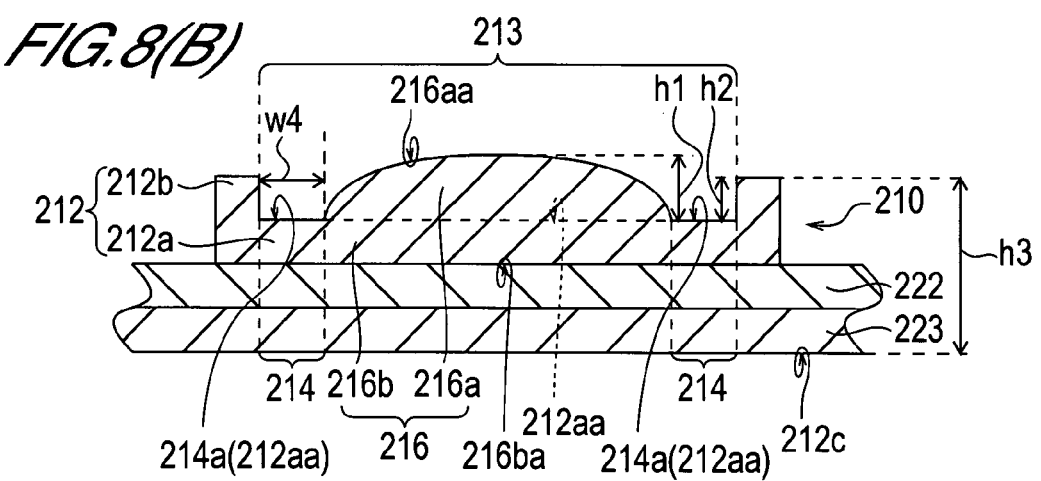

As shown in FIG. 8(B), after the etching has ended, the second resist pattern 26 is removed. The microlens 10, which has been finished further, is peeled from the BOX layer 22.

As a result of a sequence of steps mentioned above, the silicon microlens of this example is finished.

According to the method of manufacturing a microlens of the second embodiment, a lens body can be formed through the step of forming the lens portion. The formed lens body has its top level or its highest point lower than the surface of the side wall called as a frame portion. As a result, a thickness of the resist mask formed directly on the lens body may be secured to be thicker than a conventional thickness. Therefore, the microlens can be manufactured without damaging the optical characteristics even when the height of the frame portion is smaller than the maximum height of the microlens by forming the side wall with stair-like steps.

Photomask

The constitution of a photomask suitable for being applied to the method of manufacturing a micro lens of preferred embodiments will now be described.

The constitution of the photomask which is used to form the first resist pattern employed in manufacturing a lens of the first and second embodiments will now be described with reference to FIGS. 9(A), 9(B) and 9(C).

A photomask 110 has a plurality of square mask cells 140 of the same size on a transparent mask substrate 120 of quartz glass or the like. The mask cells 140 are set in a plurality of unit mask cell regions defined on one principal surface of the mask substrate 120, respectively.

These unit mask cell regions are provided close to one another. For example, the unit mask cell regions can be regions that are established by partitioning, at equal intervals, one main surface of the mask substrate 120 by means of a plurality of virtual grating lines 146 including lines drawn in an X direction (or row direction) and other lines in a Y direction (column direction), these X and Y direction lines being mutually orthogonal. Hence, in this case, the unit mask cell regions are arranged as an orthogonal matrix arrangement.

Either one or both of light transmission regions 144 and light-shielding regions 142 are set as the mask cells 140.

A light-shielding film 130 is provided by evaporating chromium and so forth, for example, on the light-shielding region 142 on the mask substrate 120. The mask cells 140 are basic units for controlling the light intensity transmitted by the photomask 110.

In the case of a mask cell 140 of the same area, the light intensity transmitted through the mask cells 140 is given by the area ratio of the optical transmission region 144 with respect to the mask cell 140. That is, the larger the area of the optical transmission region 144 in the mask cells 140, the larger the light intensity transmitted by the mask cells 140 (FIG. 9(C)).

Here, among the mask cells, when those mask cells that are arranged consecutively in the column direction comprise light-shielding regions, the light-shielding regions are provided consecutively sequentially connected in the column direction.

Furthermore, among the plurality of mask cells, when those mask cells that are arranged consecutively in the row direction comprise both light-transmission regions and light-shielding regions, the light-shielding regions are provided sequentially in a non-contact state in the row direction.

Figure 9A:
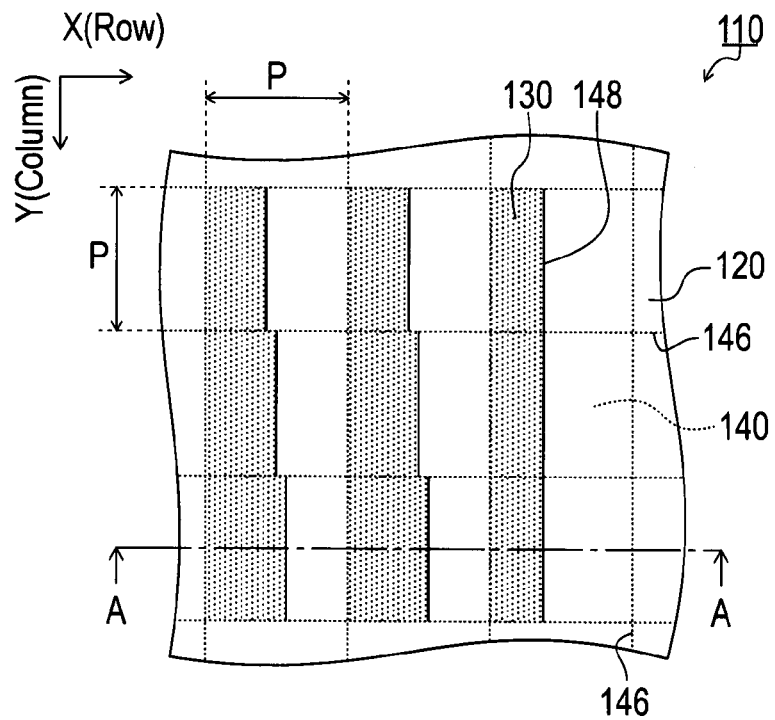
FIG. 9(A) is a schematic planar view of a part of a photomask.

Further, FIG. 9(A) shows an example in which the mask cells 140 are divided into two zones by a virtual dividing line 148 in the Y direction such that the light transmission regions 144 are established on one zone of the virtual dividing line 148 (right side of the virtual dividing line in FIG. 9(A)) and light-shielding regions 142 are established on the other zone (left side of the virtual dividing line in FIG. 9(A)).

Further, with respect to the respective mask cells, the light transmission regions 144 may be established on the same side of the virtual dividing line 148. The reasons for this will be described hereinbelow.

When the shape of the resist pattern thus formed is a curved surface shape in which the thickness varies successively (as in the case of the first resist pattern 24 described earlier, for example), mask cells 140 of the same light intensity are sometimes established successively in regions where the variation in the thickness of the resist pattern is gradual.

When the respective mask cells 140 have a constitution in which the light transmission regions 144 are established on the same side of the virtual dividing line 148, the light-shielding regions of the mask cells 140 of the same light intensity provided successively in the Y direction are constituted as one rectangle.

The data amount required for the provision of the mask pattern also increases in accordance with an increase in the number of rectangles constituting the mask pattern. Hence, when the light-shielding film 130 of the respective mask cells 140 is formed all together as one rectangle, the data amount required to provide a mask pattern can be reduced. As a result, the time taken for the manufacturing of the photomask can be shortened and the costs can be reduced.

Figure 9B:
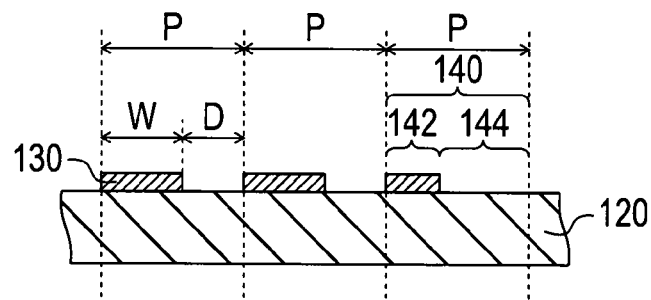
FIG. 9(B) shows a cross section taken along the line A-A of FIG. 9(A)
Figure 9C:
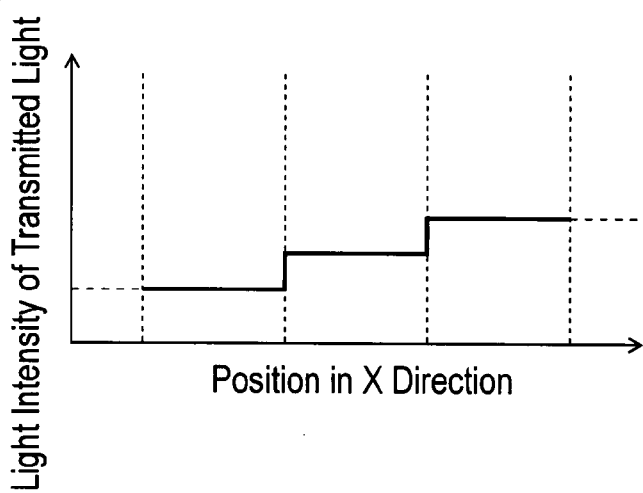
FIG. 9(C) serves to illustrate the relationship between the position in the direction (X direction) along the line A-A of FIG. 9(A) and the light intensity of the transmitted light.

FIGS. 9(A) and 9(B) show an example in which both the light transmission regions 144 and light-shielding regions 142 are established for all the mask cells 140 but the embodiment is not limited to this example.

Specifically, the photomask 110 may comprise mask cells in which only light transmission regions 144 are established, that is, in which there are no light-shielding regions, or mask cells in which only light-shielding regions 142 have been established as the mask cells 140, that is, in which there are no light transmission regions.

The length of one side of the mask cells 140 (also sometimes called the 'mask pitch' hereinbelow) P is made smaller than the length which is the resolution limit for the optical system of the aligner in which the photomask 110 is employed. Hence, when exposure processing is performed on the resist layer by using the photomask 110, a level of contrast that permits the resolution of the mask pattern of the photomask is not obtained.

When development is carried out after the resist layer has been exposed by using the photomask 110, the thickness of a resist pattern which has been applied to the substrate varies successively, for example, without separating the resist pattern from the substrate.

When a so-called i-line stepper the wavelength $\lambda$ of which is 365 nm and for which the reduced projection magnification is five times is used, for example, as the aligner, the resolving performance of the exposure optical system depends on the numerical aperture NA and coherence factor $\sigma$ of the projection lens.

Table 1 shows the dependency of the optical contrast M with respect to the pitch, numerical aperture NA, and the coherence factor $\sigma$. Here, the ratio between the width D of the optical transmission region (space) 144 and the width W of the light-shielding region (line) 142 is 1:1.

TABLE 1

| Pitch | NA | | | | | | | | |
|---|---|---|---|---|---|---|---|---|---|
| | 0.50 | | | 0.55 | | | 0.60 | | |
| | $\sigma$ | | | | | | | | |
| (nm) | 0.3 | 0.5 | 0.7 | 0.3 | 0.5 | 0.7 | 0.3 | 0.5 | 0.7 |
| 400 | 0 | 0 | 0 | 0 | 0 | 0.02 | 0 | 0 | 0.15 |
| 500 | 0 | 0.03 | 0.22 | 0 | 0.25 | 0.40 | 0.20 | 0.46 | 0.55 |
| 600 | 0.19 | 0.46 | 0.55 | 0.57 | 0.67 | 0.69 | 0.87 | 0.84 | 0.81 |

The pitch corresponds to the length obtained by projecting the mask pitch P onto the upper face of the resist layer. When the reduced projection magnification is five times, this pitch is 1/5 of the mask pitch P.

The optical contrast M is represented by M=(Imax−Imin)/(Imax+Imin). The light intensity of the light transmitted by the photomask varies sinusoidally and the maximum value of the light intensity in the one cycle is Imax and the minimum value is Imin.

Generally, the resolving power of the exposure optical system is proportional to $\lambda$/NA. Accordingly, the shorter the wavelength or the larger the numerical aperture NA, the smaller the pitch with which the optical contrast M is 0, that is, the pitch with which the contrast permitting resolution of the mask pattern of the photomask is not obtained.

For example, when the pitch of the resist is no more than 480 nm (mask pitch P is 2.4 μm) in cases where the numerical aperture NA is 0.5 and the coherence factor $\sigma$ is 0.5, the optical contrast M of the light intensity of the transmitted light projected onto the wafer is then 0.

However, the optical contrast M is not limited to 0 and, even when a little optical contrast M is produced, the effect exerted by the optical contrast M on the resist may be within the permissible range.

For example, when the pitch is made 500 nm in cases where the numerical aperture NA is 0.5 and the coherence factor $\sigma$ is 0.5, the optical contrast M is then 0.03 but the effect exerted by the optical contrast M in this case on the resist is within the permissible range.

As mentioned earlier, the upper limit for the mask pitch P is decided by the exposure optical system depending on the mask pitch size at which the optical contrast M is 0.

On the other hand, the shorter the mask pitch P, the higher the resolving power in the horizontal direction. However, rendering the width D of the light transmission regions 144 and the width W of the light-shielding regions 142 which can be fabricated as a photomask small is technologically difficult. Hence, when the length P of one side of the mask cells 140 is made small by fixing the minimum value of the width D of the light transmission regions 144 and the width W of the light-shielding regions 142, the variable width of the light intensity becomes small.

For example, when the pitch at the resist pattern level is 480 nm, the minimum dimension of the resist pattern level of the mask fabrication technology that can be used is 150 nm.

In the following description, except where particular reference is made, conversion to the dimensions of the resist pattern is employed for the dimension. The dimensions of the photomask may be obtained by multiplying the dimensions of the resist pattern level by the reduced projection magnification, which is five here. Thereupon, the space width, that is, the width of the light transmission region obtained by conversion to the dimensions of the resist pattern level can be set from 150 nm to 330 nm.

On the other hand, suppose that, when the pitch is 400 nm, the minimum dimension that can be used with the mask fabrication technology is 150 nm. Here, the space width that can be set is in the range of 150 nm to 250 nm.

The number of gray scales of the light in a case where the space width is controlled in 1 nm units is 181 when the pitch is 480 nm and 101 when the pitch is 400 nm.

When the pitch is small, the number of gray scales of light, that is, the resolving power of the light intensity drops. Further, the aperture area ratio within the cells is in the range of 31% to 69% when the pitch is 480 nm and is in the range of 38% to 63% when the pitch is 400 nm. That is, when the pitch is small, the variable width of the light intensity is then narrow.

If a highly accurate mask fabrication technology is used, that is, if the minimum dimension of the mask fabrication technology is small, the pitch of the resist can be reduced with the same number of gray scales.

For example, if the pitch is 300 nm and the minimum dimension of the resist is 70 nm, the space width that can be established is in the range from 70 nm to 230 nm and the number of gray scales obtained when control is exercised in 1 nm units is 161.

However, the reduction of the minimum dimension brings about an increase in the mask costs. Hence, the pitch of the resist necessitates the selection of optimum conditions by considering the target pattern, the optical exposure system, the minimum dimension of the mask fabrication technology, and the mask cost. When the size of the resist pattern which is the target is sufficiently large from a few dozen μm to a few hundred μm, the pitch of the resist pattern is suitably in the range from 400 nm to 500 nm.

According to the above-described photomask used for the resist pattern formation, the transmitted light intensity can be set for each mask cell. Hence, in cases where an arbitrary pattern shape with a stepped portion as described in the second embodiment or an arbitrary shape in which the resist thickness at points where the distance from the center is equal is not equal is formed, for example, the required photomask is easily obtained.

In the case of the method of fabricating a microlens of the size described earlier of the present invention, when the size of a suitable photomask that is applied when the resist pattern is formed is exemplified, the pitch is 400 nm and the minimum space width, that is, the width of the light transmission region is 120 nm and the maximum space width is 280 nm.

Figure 10:
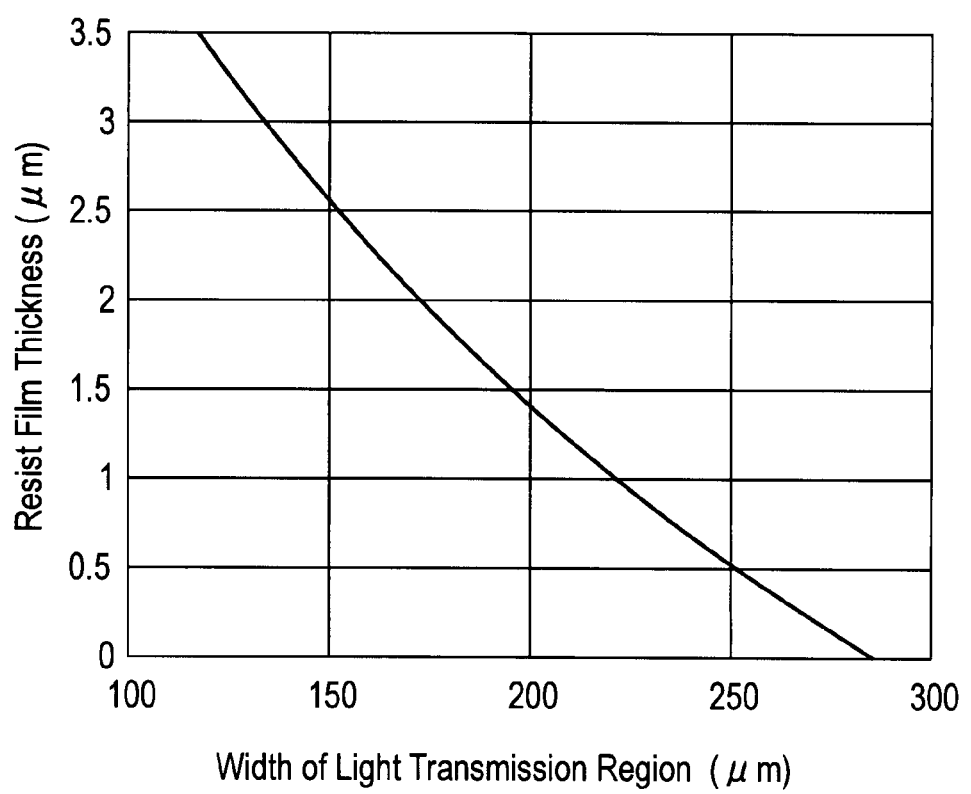
FIG. 10 is a graph showing the relationship between the width of the light transmission region and the thickness of the remaining resist pattern.

FIG. 10 shows, in the form of a graph, the relationship between the width of the light transmission regions with a pitch of 1 and the thickness of the remaining resist pattern when the above resist A is used and exposure and development are performed by using the photomask.

The thickness of the remaining resist pattern decreases as the width of the light transmission region increases.

Thus, the disposition of the mask cells 140 of the photomask 110 can be optimized such that a predetermined resist pattern shape is obtained based on the relationship between the width of the light transmission region and the thickness of the remaining resist pattern.

That is, the light intensity of the transmitted light of the mask cells 140 of a suitable photomask 110 that is applied in the fabrication step of the microlens of the present invention can be the normalized light intensity. In other words, the normalized light intensity is the value of the intensity of the light transmitted by the other mask cells for which the maximum light intensity is determined as 1 when the intensity of the light transmitted by any mask cell among the multiplicity of mask cells is maximum. Hence, let the normalized light intensity be 1 or 0 or any value therebetween. The normalized light intensity determined based on the design in each case is allocated to each of the mask cells.

The light intensity of the transmitted light of the mask cells will now be described with reference to FIGS. 11(A) and 11(B).

Figure 11A:
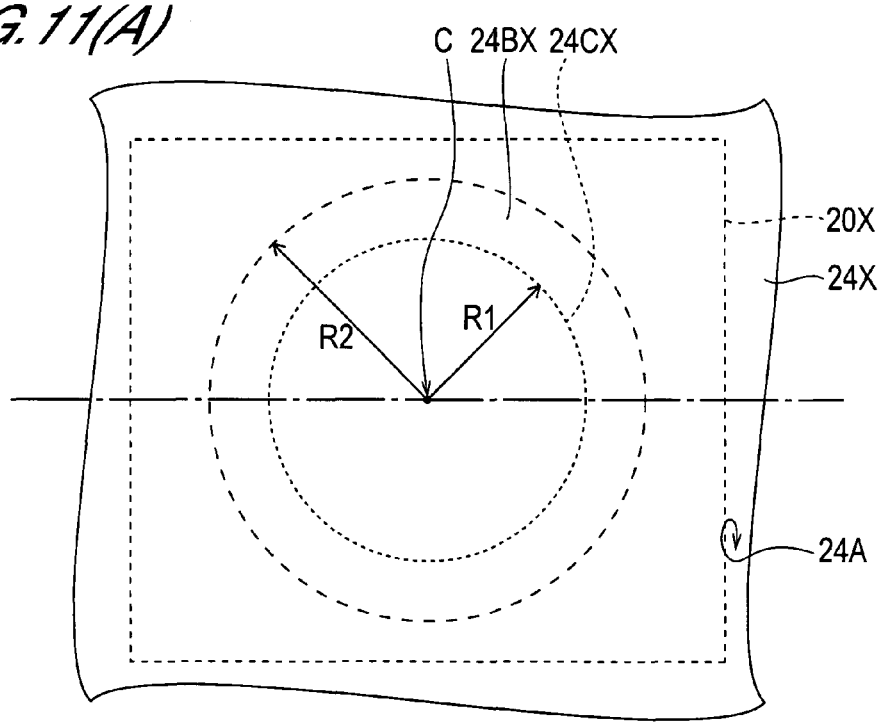
FIG. 11(A) is a planar view of the resist layer which is the exposure target.
Figure 11B:
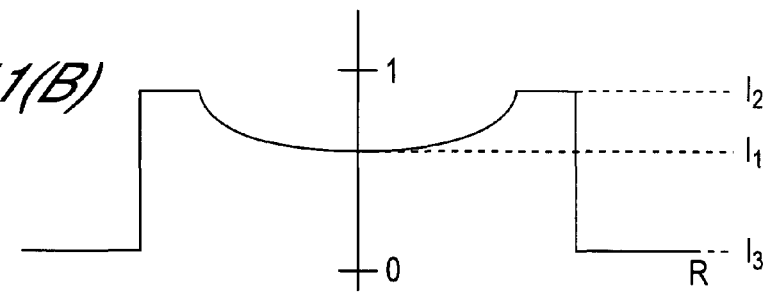
FIG. 11(B) is a graph showing the light intensity of the exposure region.

As shown in FIGS. 11(A) and 11(B), when the microlens of an embodiment in which the convex lens body of the present invention is housed in a frame portion is formed, the light intensity of the transmitted light of the plurality of mask cells 140 is such that the light intensity of the mask cells 140 at the center C of the mask protrusion formation region 24CX which is a first circle with a first radius R1 is a first intensity $I_1$ (where $0<I_1<1$). Further, all the light intensities of the mask cells in the annular region between a first circle and a second circle with a second radius R2 of a mask bottom surface formation region 24BX that is concentric with the first circle (where R1<R2) is the second light intensity $I_2$.

In addition, all the light intensities of the mask cells in the region outside the second circle are set as the third light intensity $I_3$ (where $I_1$ $I_2$, and $I_3$ are such that $0 \leq I_3 < I_1$ and $0 < I_1 < I_2$) and the light intensities of the sequential mask cells which are lined up on the first radius from the center O of the first circle to the second circle are set at values for which the amount of change in the light intensity between a prior mask cell and a subsequent mask cell becomes larger toward the second circle, these values being mutually discrete, from the first light intensity $I_1$ to the second light intensity $I_2$.

Figure 11C:
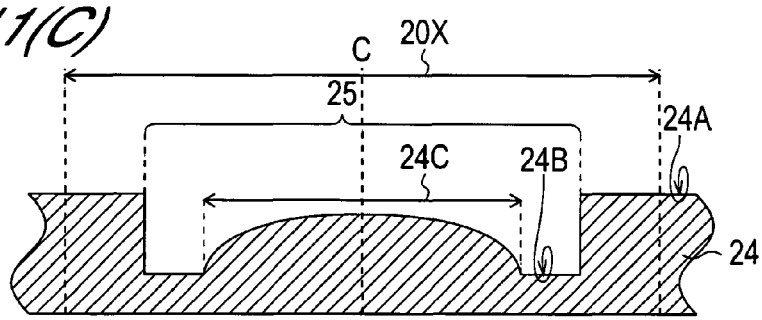
FIG. 11(C) is a schematic diagram of the resist pattern thus formed.

As a result of making settings in this way, a resist pattern with the shape described earlier which is shown in FIG. 11C can be formed.

Further, in this case, the exposure conditions may be such that the numerical aperture NA is 0.5, the coherence factor a is 0.5, and the reduced projection multiplication is five times.

Under such conditions, the first resist pattern (24) including a protrusion with a curved surface that may be approximated using sixteen gray scale levels can be formed.

What is claimed is:

1. A microlens, comprising:
   a frame portion having a recess, and having a peripheral wall portion; and
   a lens body that is provided in said recess and which is integrated with said frame portion,
   wherein a highest point of a height of said lens body is lower than a height of said frame portion; and
   wherein a ratio between a distance from an inside wall edge of said peripheral wall portion to a peripheral edge of said lens body, a height of the peripheral wall portion, and a width of the peripheral wall portion is in a range from 1:1:1 to 1:2:2.

2. A microlens, comprising:
   a frame portion having a recess; and
   a lens body that is provided in said recess and which is integrated with said frame portion,
   wherein a material of said frame portion and said lens body are silicon, respectively.

* * * * *